United States Patent
Shinohara

(10) Patent No.: US 7,638,707 B2
(45) Date of Patent: Dec. 29, 2009

(54) PHOTOVOLTAIC CELL, PHOTOVOLTAIC CELL MODULE, METHOD OF FABRICATING PHOTOVOLTAIC CELL AND METHOD OF REPAIRING PHOTOVOLTAIC CELL

(75) Inventor: Wataru Shinohara, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 792 days.

(21) Appl. No.: 11/168,489

(22) Filed: Jun. 29, 2005

(65) Prior Publication Data
US 2005/0284517 A1 Dec. 29, 2005

(30) Foreign Application Priority Data
Jun. 29, 2004 (JP) ............................. 2004-192286

(51) Int. Cl.
*H01L 31/042* (2006.01)
(52) U.S. Cl. ..................................... 136/244; 136/249
(58) Field of Classification Search ................. 136/244, 136/249
See application file for complete search history.

(56) References Cited

U.S. PATENT DOCUMENTS

| 6,228,662 | B1 | 5/2001 | Hayashi et al. |
| 6,278,055 | B1 * | 8/2001 | Forrest et al. ............... 136/263 |
| 6,632,993 | B2 | 10/2003 | Hayashi et al. |
| 2003/0172967 | A1 | 9/2003 | Tachibana et al. |

FOREIGN PATENT DOCUMENTS

| JP | 2000-277765 | 10/2000 |
| JP | 2000-277775 | 10/2000 |
| JP | 2002-523904 | 7/2002 |
| JP | 2002-261308 | 9/2002 |
| JP | 2002-261309 | 9/2002 |
| JP | 2002-261313 | 9/2002 |
| JP | 2003-273383 | 9/2003 |
| JP | 2003-298089 | 10/2003 |
| WO | WO 00/11725 | 3/2000 |

OTHER PUBLICATIONS

Japanese Notice of Reasons for Refusal, with English Translation, issued in Japanese Patent Application No. JP 2004-192286, dated Jun. 2, 2009.

* cited by examiner

*Primary Examiner*—Kaj K Olsen
(74) *Attorney, Agent, or Firm*—McDermott Will & Emery LLP

(57) ABSTRACT

A plurality of first separation grooves are formed in a back electrode. Second separation grooves having a width smaller than that of the first separation grooves are formed by removing a second photovoltaic conversion layer and an intermediate reflective layer inside the first separation grooves. Third separation grooves having a width smaller than that of the second separation grooves are formed by removing a first photovoltaic conversion layer and a light reflective electrode inside the second separation grooves. Corners of the first photovoltaic conversion layer and corners of the second photovoltaic conversion layer that are exposed in the separation grooves are removed by performing plasma etching, so that the upper surfaces of side ends of the intermediate reflective layer are exposed.

8 Claims, 11 Drawing Sheets

(a)          (b)

PHOTOVOLTAIC CELL, PHOTOVOLTAIC CELL MODULE, METHOD OF FABRICATING PHOTOVOLTAIC CELL AND METHOD OF REPAIRING PHOTOVOLTAIC CELL

BACKGROUND OF THE INVENTION

1. Field of the Invention

The present invention relates to tandem photovoltaic cells, photovoltaic cell modules comprising the tandem photovoltaic cells, a method of fabricating the tandem photovoltaic cells, and a method of repairing the tandem photovoltaic cells.

2. Description of the Background Art

Tandem photovoltaic cells have been developed for enhancing the photovoltaic conversion efficiency. FIG. 12 is a cross section showing an example of a thin film photovoltaic conversion module that includes conventional tandem photovoltaic conversion cells (refer to JP 2002-261308 A, for example). The thin film photovoltaic conversion module shown in FIG. 12 has a plurality of photovoltaic conversion cells 120. Each photovoltaic conversion cell 120 has a tandem structure that includes a transparent front electrode layer 122, an amorphous photovoltaic conversion layer 123, an intermediate reflective layer 124, a crystalline photovoltaic conversion layer 125, and a back electrode layer 126 in order on a transparent substrate 121. Adjacent photovoltaic conversion cells 120 are separated from one another through separation grooves 127. The transparent front electrode layer 122 of each photovoltaic conversion cell 120 is connected to the back electrode 126 of an adjacent other photovoltaic conversion cell 120. In this way, the plurality of photovoltaic conversion cells 120 are serially connected.

Such tandem photovoltaic conversion cells 120 are capable of absorbing light in a wide range of wavelengths through the amorphous photovoltaic conversion layer 123 and the crystalline photovoltaic conversion layer 125, thus providing high conversion efficiency. In addition, the provision of the intermediate reflective layer 124 allows an increase in the amount of light incident to the amorphous photovoltaic conversion layer 123. This enables an increased amount of power that is generated in the amorphous photovoltaic conversion layer 123.

The present inventors, however, found that such a thin film photovoltaic conversion module with an intermediate reflective layer has following problems occurring during the formation of separation grooves by etching.

FIG. 13 is a diagram for illustrating the problems during the formation of separation grooves. When forming a separation groove 132 in the thin film photovoltaic conversion module shown in FIG. 13 by etching, the intermediate reflective layer 131 and the back electrode 133 are more difficult to etch than the first photovoltaic conversion layer 134 and the second photovoltaic conversion layer 135. This causes side-etching of the first photovoltaic conversion layer 134 and the second photovoltaic conversion layer 135. Consequently, as shown in FIG. 13, the side surfaces of the first photovoltaic conversion layer 134 and the second photovoltaic conversion layer 135 are concave, and the side ends of the intermediate reflective layer 131 and the back electrode 133 remain in the form of girders toward the separation groove 132 side. If the remaining girder-formed portions of the intermediate reflective layer 131 and the back electrode 133 bend to contact a light receptive electrode 136 and the intermediate reflective layer 131, this causes short circuits in the first photovoltaic conversion layer 134 and the second photovoltaic conversion layer 135.

During the fabrication process of a thin film photovoltaic conversion module, a short circuit may also occur between the electrodes when a pinhole develops in a photovoltaic conversion layer of a photovoltaic conversion cell.

For thin film photovoltaic conversion modules comprising single-layer photovoltaic conversion cells, a method for recovering short-circuited portions is suggested. According to the method, when a short circuit occurs between the electrodes of a photovoltaic conversion cell during the fabrication process, a reverse bias voltage is applied between the electrodes for repairing the short-circuited portion (refer to e.g. JP 2000-277775 A). In the specification, this repairing method will be referred to as "reverse bias repair".

FIG. 14 is a diagram showing the equivalent circuit of a single-layer photovoltaic conversion cell during reverse bias repair. A photovoltaic conversion layer, which is equivalent to a diode, functions as a capacitor C3 when a reverse bias voltage is applied. A short-circuited portion, which is equivalent to a resistance, is represented by R.

When a reverse bias voltage is applied between the electrodes, a current selectively flows in the short-circuited portion R to generate Joule's heat. The Joule's heat causes the metal of the short-circuited portion R to become an insulator through oxidization or causes the metal to fly to pieces, thereby recovering the short-circuited portion R.

The above-described reverse bias repair, however, is not applicable to tandem photovoltaic conversion cells, because of the reasons as described below.

FIG. 15 is a diagram showing the equivalent circuit of a tandem photovoltaic conversion cell with two photovoltaic conversion layers when a reverse bias voltage is applied. The photovoltaic conversion layers in the tandem photovoltaic conversion cell, which are equivalent to diodes, function as capacitors C4, C5, respectively, when a reverse bias voltage is applied. A short-circuited portion, which is equivalent to a resistance, is represented by R.

The presence of the capacitor C4 between one electrode and the short-circuited portion R inhibits a current to flow in the short-circuited portion R when a reverse bias voltage is applied between the electrodes. For this reason, the reverse bias repair is not applicable to tandem photovoltaic conversion cells. It has therefore been difficult to recover short-circuited portions in photovoltaic conversion modules with tandem photovoltaic conversion cells.

SUMMARY OF THE INVENTION

An object of the present invention is to provide a tandem photovoltaic cell that is prevented from generation of a short-circuited portion during fabrication, and whose short-circuited portion can be recovered by applying a reverse bias voltage, and provide a photovoltaic cell module comprising such tandem photovoltaic cells and a method of fabricating such tandem photovoltaic cells.

Another object of the present invention is to provide a method of repairing tandem photovoltaic cells.

According to one aspect of the present invention, a photovoltaic cell comprises, in an order listed below, a first electrode, a first photovoltaic conversion layer, a conductive intermediate reflective layer, a second photovoltaic conversion layer, and a second electrode, the intermediate reflective layer reflecting part of light while transmitting a rest of the light, a side end of the intermediate reflective layer protruding more laterally than a side end of the second electrode, a side end of the first electrode protruding more laterally than the side end of the intermediate reflective layer, an upper surface of the side end of the intermediate reflective layer being exposed from the second photovoltaic conversion layer.

In the photovoltaic cell, a side end of the intermediate reflective layer protrudes more laterally than a side end of the second electrode, and a side end of the first electrode protrudes more laterally than the side end of the intermediate reflective layer, with the upper surface of the side end of the intermediate reflective layer being exposed.

In this case, a side end of the second photovoltaic conversion layer protrudes more laterally than the second electrode. Accordingly, a side end of the second electrode does not remain in the girder form even if the second photovoltaic conversion layer is side-etched during the removal of the side end of the second photovoltaic conversion layer by etching. Moreover, a side end of the first photovoltaic conversion layer protrudes more laterally than the intermediate reflective layer. Accordingly, the side end of the intermediate reflective layer does not remain in the girder form even if the first photovoltaic conversion layer is side-etched during the removal of the side end of the first photovoltaic conversion layer by etching. This prevents the side ends of the second electrode and intermediate reflective layer from bending to contact the intermediate reflective layer and the first electrode, so as to prevent short-circuits in the second and the first photovoltaic conversion layers.

In addition, the exposed upper surface of the side end of the intermediate reflective layer can be used as an electrode, allowing reverse bias voltages to be applied between the first electrode and the intermediate reflective layer and between the intermediate reflective layer and the second electrode, respectively. Thus, even if the first photovoltaic conversion layer and the second photovoltaic conversion layer are short-circuited, the short-circuited portions can be recovered by applying reverse bias voltages.

An upper surface of the side end of the first electrode may be exposed from the first photovoltaic conversion layer.

This facilitates and ensures the connection of a connecting piece onto the exposed upper surface of the side end of the first electrode.

The length of a portion of the first electrode that protrudes more laterally than the intermediate reflective layer may be greater than the thickness of the first photovoltaic conversion layer, and the length of a portion of the intermediate reflective layer that protrudes more laterally than the side end of the second electrode may be greater than the thickness of the second photovoltaic conversion layer.

In this way, the length of the side end of the second photovoltaic conversion layer that protrudes more laterally than the second electrode is greater than the thickness of the second photovoltaic conversion layer. Accordingly, the side end of the second electrode does not remain in the girder form even when the side end of the second photovoltaic conversion layer is etched away until the upper surface of the side end of the intermediate reflective layer becomes exposed. Moreover, the length of the side end of the first photovoltaic conversion layer that protrudes more laterally than the first intermediate reflective layer is greater than the thickness of the first photovoltaic conversion layer. Accordingly, the side end of the intermediate reflective layer does not remain in the girder form even when the side end of the first photovoltaic conversion layer is etched away until the upper surface of the side end of the first electrode becomes exposed. This prevents the side ends of the second electrode and the intermediate reflective layer from bending to contact the intermediate reflective layer and the first electrode, so as to prevent short-circuits in the second photovoltaic conversion layer and the first photovoltaic conversion layer.

The first photovoltaic conversion layer may include amorphous silicon, and the second photovoltaic conversion layer may include crystalline silicon.

In this case, light with short wavelengths is absorbed by the first photovoltaic conversion layer, and light with long wavelengths is absorbed by the second photovoltaic conversion layer. This enables photovoltaic conversion of light in a wider range of wavelengths.

Note that the crystalline silicon includes microcrystalline silicon.

The first electrode may include a transparent conductive oxide.

This allows a first electrode side to serve as a main light incident surface. Part of the light incident from the first electrode side is reflected on the intermediate reflective layer. This means that with the first electrode side serving as a light incident surface, the amount of light incident to the first photovoltaic conversion layer is greater than the amount of light incident to the second photovoltaic conversion layer. This allows the amount of power generated in the first photovoltaic conversion layer to be increased. As a result, the first photovoltaic conversion layer can be made thinner.

The intermediate reflective layer may include a transparent conductive oxide.

In this case, part of the light incident from the first or the second photovoltaic conversion layer to the intermediate reflective layer is reflected on the intermediate reflective layer, and then again incident to the first or the second photovoltaic conversion layer. This allows the amount of power generated in the first or second photovoltaic conversion layer to be increased. As a result, the first or the second photovoltaic conversion layer can be made thinner.

The second electrode may include a metal.

In this case, the light incident from a first photovoltaic conversion layer side and passing through the first photovoltaic conversion layer, intermediate reflective layer, and second photovoltaic conversion layer is reflected on the second electrode, and then again incident to the second photovoltaic conversion layer and the first photovoltaic conversion layer. This allows the amount of power generated in each of the first and second photovoltaic conversion layers to be increased. As a result, the first and second photovoltaic conversion layers can be made thinner.

According to another aspect of the present invention, a photovoltaic cell module comprises a substrate, and a plurality of photovoltaic cells that are aligned on the substrate, the plurality of photovoltaic cells being separated from each other through a groove, each of the plurality of photovoltaic cells comprising, in an order listed below, a first electrode, a first photovoltaic conversion layer, a conductive intermediate reflective layer, a second photovoltaic conversion layer, and a second electrode, the intermediate reflective layer reflecting part of light while transmitting a rest of the light, a side end of the intermediate reflective layer protruding more laterally than a side end of the second electrode in the groove, a side end of the first electrode protruding more laterally than the side end of the intermediate reflective layer in the groove, an upper surface of the side end of the intermediate reflective layer being exposed from the second photovoltaic conversion layer, the second electrode of one photovoltaic cell of the plurality of photovoltaic cells and the first electrode of another photovoltaic cell of the plurality of photovoltaic cells being electrically connected through a connecting piece.

In the photovoltaic cell module, the second electrode of one photovoltaic cell and the first electrode of another photovoltaic cell are electrically connected through the connecting piece. A side end of the intermediate reflective layer of each photovoltaic cell protrudes more laterally than a side end of the second electrode, and a side end of the first electrode protrudes more laterally than the side end of the intermediate reflective layer, with the upper surface of the side end of the intermediate reflective layer being exposed.

In this case, a side end of the second photovoltaic conversion layer protrudes more laterally than the second electrode. Accordingly, a side end of the second electrode does not remain in the girder form even if the second photovoltaic conversion layer is side-etched during the removal of the side end of the second photovoltaic conversion layer by etching. Moreover, a side end of the first photovoltaic conversion layer protrudes more laterally than the intermediate reflective layer. Accordingly, the side end of the intermediate reflective layer does not remain in the girder form even if the first photovoltaic conversion layer is side-etched during the removal of the side end of the first photovoltaic conversion layer by etching. This prevents the side ends of the second electrode and intermediate reflective layer from bending to contact the intermediate reflective layer and the first electrode, so as to prevent short-circuits in the second and the first photovoltaic conversion layers.

In addition, the exposed upper surface of the side end of the intermediate reflective layer can be used as an electrode, allowing reverse bias voltages to be applied between the first electrode and the intermediate reflective layer and between the intermediate reflective layer and the second electrode, respectively. Thus, even if the first photovoltaic conversion layer and the second photovoltaic conversion layer are short-circuited, the short-circuited portions can be recovered by applying reverse bias voltages.

The first photovoltaic conversion layer may include amorphous silicon, and the second photovoltaic conversion layer may include crystalline silicon.

In this case, light with short wavelengths is absorbed by the first photovoltaic conversion layer, and light with long wavelengths is absorbed by the second photovoltaic conversion layer. This enables photovoltaic conversion of light in a wider range of wavelengths.

The first electrode may include a transparent conductive oxide.

This allows a first electrode side to serve as a main light incident surface. Part of the light incident from the first electrode side is reflected on the intermediate reflective layer. This means that with the first electrode side serving as a light incident surface, the amount of light incident to the first photovoltaic conversion layer is greater than the amount of light incident to the second photovoltaic conversion layer. This allows the amount of power generated in the first photovoltaic conversion layer to be increased. As a result, the first photovoltaic conversion layer can be made thinner.

The intermediate reflective layer may include a transparent conductive oxide.

In this case, part of the light incident from the first or the second photovoltaic conversion layer to the intermediate reflective layer is reflected on the intermediate reflective layer, and then again incident to the first or the second photovoltaic conversion layer. This allows the amount of power generated in the first or second photovoltaic conversion layer to be increased. As a result, the first or the second photovoltaic conversion layer can be made thinner.

The second electrode may include a metal.

In this case, the light incident from a first photovoltaic conversion layer side and passing through the first photovoltaic conversion layer, intermediate reflective layer, and second photovoltaic conversion layer is reflected on the second electrode, and then again incident to the second photovoltaic conversion layer and the first photovoltaic conversion layer. This allows the amount of power generated in each of the first and second photovoltaic conversion layers to be increased. As a result, the first and second photovoltaic conversion layers can be made thinner.

According to still another aspect of the present invention, a method of fabricating a photovoltaic cell comprises the steps of: forming, in order, a first electrode, a first photovoltaic conversion layer, a conductive intermediate reflective layer, a second photovoltaic conversion layer, and a second electrode; forming a first groove by removing a region of a predetermined width from the second electrode; forming a second groove having a width smaller than that of the first groove by removing the second photovoltaic conversion layer and the intermediate reflective layer in the first groove; forming a third groove having a width smaller than that of the second groove by removing the first photovoltaic conversion layer and the first electrode in the second groove; and removing the second photovoltaic conversion layer at an edge portion of the second groove so that an upper surface of a side end of the intermediate reflective layer is exposed, and also removing the first photovoltaic conversion layer at an edge portion of the third groove.

In the method of fabricating the photovoltaic cell, the second groove has a width smaller than that of the first groove, so that a side end of the intermediate reflective layer protrudes more laterally than a side end of the second electrode. Also, the third groove has a width smaller than that of the second groove, so that a side end of the first electrode protrudes more laterally than the side end of the intermediate reflective layer. Further, the upper surface of the side end of the intermediate reflective layer is exposed.

In this case, a side end of the second photovoltaic conversion layer protrudes more laterally than the second electrode. Accordingly, a side end of the second electrode does not remain in the girder form even if the second photovoltaic conversion layer is side-etched during the removal of the side end of the second photovoltaic conversion layer by etching. Moreover, a side end of the first photovoltaic conversion layer protrudes more laterally than the intermediate reflective layer. Accordingly, the side end of the intermediate reflective layer does not remain in the girder form even if the first photovoltaic conversion layer is side-etched during the removal of the side end of the first photovoltaic conversion layer by etching. This prevents the side ends of the second electrode and intermediate reflective layer from bending to contact the intermediate reflective layer and the first electrode, so as to prevent short-circuits in the second and the first photovoltaic conversion layers.

In addition, the exposed upper surface of the side end of the intermediate reflective layer can be used as an electrode, allowing reverse bias voltages to be applied between the first electrode and the intermediate reflective layer and between the intermediate reflective layer and the second electrode, respectively. Thus, even if the first photovoltaic conversion layer and the second photovoltaic conversion layer are short-circuited, the short-circuited portions can be recovered by applying reverse bias voltages.

The step of removing the first photovoltaic conversion layer may include the step of removing the first photovoltaic conversion layer in the third groove so that an upper surface of a side end of the first electrode is exposed.

This facilitates and ensures the connection of the connecting piece onto the exposed upper surface of the side end of the first electrode.

The step of forming the second groove may include the step of forming the second groove so that the distance between a side end of the second electrode and a side end of the second photovoltaic conversion layer is greater than the thickness of the second photovoltaic conversion layer, and the step of forming the third groove may include the step of forming the third groove so that the distance between a side end of the intermediate reflective layer and a side end of the first photovoltaic conversion layer is greater than the thickness of the first photovoltaic conversion layer.

In this way, the length of the side end of the second photovoltaic conversion layer that protrudes more laterally than the second electrode is greater then the thickness of the second photovoltaic conversion layer. Accordingly, the side end of the second electrode does not remain in the girder form even when the side end of the second photovoltaic conversion layer is etched away until the upper surface of the side end of the intermediate reflective layer becomes exposed. Moreover, the length of the side end of the first photovoltaic conversion layer that protrudes more laterally than the first intermediate reflective layer is greater than the thickness of the first photovoltaic conversion layer. Accordingly, the side end of the intermediate reflective layer does not remain in the girder form even when the side end of the first photovoltaic conversion layer is etched away until the upper surface of the side end of the first electrode becomes exposed. This prevents the side ends of the second electrode and the intermediate reflective layer from bending to contact the intermediate reflective layer and the first electrode, so as to prevent short-circuits in the second photovoltaic conversion layer and the first photovoltaic conversion layer.

The step of forming the first groove may include the step of removing the second electrode using a laser beam.

This allows the region of the predetermined width to be removed reliably and accurately from the second electrode.

The step of forming the second groove may include the step of removing the second photovoltaic conversion layer and the intermediate reflective layer using a laser beam.

This allows the second photovoltaic conversion layer and the intermediate reflective layer to be removed reliably and accurately in a width smaller than that of the first groove.

The step of forming the third groove may include the step of removing the first photovoltaic conversion layer and the first electrode using a laser beam.

This allows the first photovoltaic layer and the first electrode to be removed reliably and accurately in a width smaller than that of the second groove.

The step of removing the second photovoltaic conversion layer at an edge portion of the second groove, and also removing the first photovoltaic conversion layer at an edge portion of the third groove may include the step of removing the second photovoltaic conversion layer and the first photovoltaic conversion layer by plasma etching.

This allows simultaneous removal of the first and second photovoltaic conversion layers in an etching gas atmosphere. This results in improved throughput.

The method may further includes the step of applying a reverse bias voltage between one of the first and second electrodes and the exposed upper surface of the intermediate reflective layer.

In this way, reverse bias voltages can be applied between the first electrode and the intermediate reflective layer and between the intermediate reflective layer and the second electrode, respectively. Thus, even if the first photovoltaic conversion layer and the second photovoltaic conversion layer are short-circuited during the fabrication of the photovoltaic cell, the short-circuited portions can be recovered by applying reverse bias voltages.

According to yet another aspect of the present invention, a method of repairing a photovoltaic cell for repairing a photovoltaic cell that comprises, in order, a first electrode, a first photovoltaic conversion layer, a conductive intermediate reflective layer, a second photovoltaic conversion layer, and a second electrode, the intermediate reflective layer reflecting part of light while transmitting a rest of the light, a side end of the intermediate reflective layer protruding more laterally than a side end of the second electrode, a side end of the first electrode protruding more laterally than the side end of the intermediate reflective layer, an upper surface of the side end of the intermediate reflective layer being exposed through the second photovoltaic conversion layer, comprises the step of applying a reverse bias voltage between one of the first and second electrodes and the exposed upper surface of the intermediate reflective layer.

In this way, a side end of the intermediate reflective layer of the photovoltaic cell protrudes more laterally than a side end of the second electrode, and a side end of the first electrode protrudes more laterally than the side end of the intermediate reflective layer, with the upper surface of the side end of the intermediate reflective layer being exposed. This allows reverse bias voltages to be applied between the first electrode and the intermediate reflective layer and between the intermediate reflective layer and the second electrode, respectively. Thus, even if the first photovoltaic conversion layer and the second photovoltaic conversion layer are short-circuited, the short-circuited portions can be recovered by applying reverse bias voltages.

According to the present invention, side ends of the second electrode and the intermediate reflective layer can be prevented from bending to contact the intermediate reflective layer and the first electrode, and consequently, short-circuits in the second photovoltaic conversion layer and the first photovoltaic conversion layer can be prevented.

In addition, even if the first photovoltaic conversion layer and the second photovoltaic conversion layer are short-circuited, the short-circuited portions can be recovered by applying reverse bias voltages.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

First Embodiment

Figure 1:
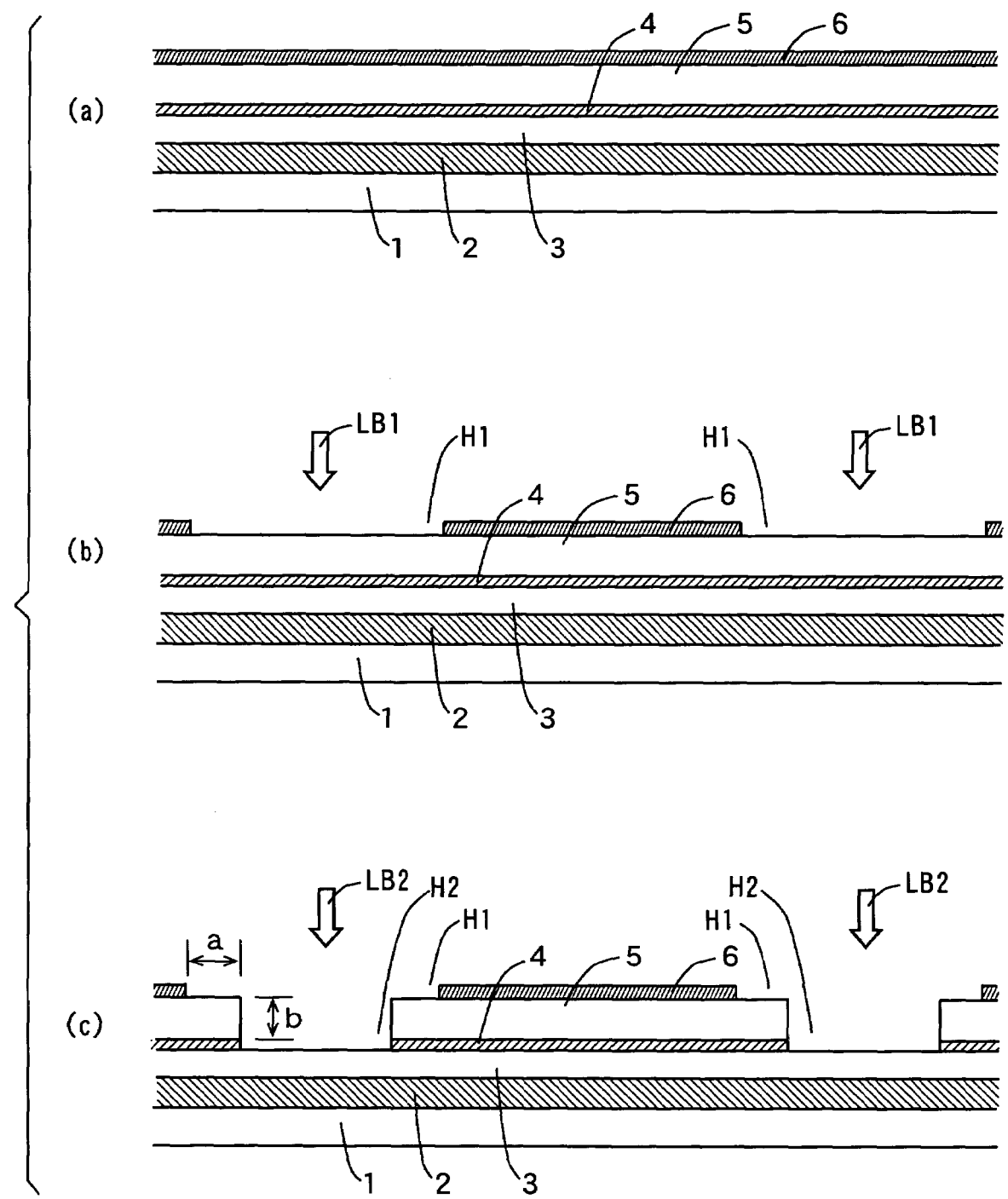
FIGS. 1 (a), 1 (b), 1 (c) are schematic cross sections showing the steps of a method for fabricating a tandem photovoltaic cell module according to a first embodiment of the invention; b FIGS. 2 (d), 2 (e), 2 (f) are schematic cross sections showing the steps of the method for fabricating the tandem photovoltaic cell module according to the first embodiment of the invention.
Figure 2:
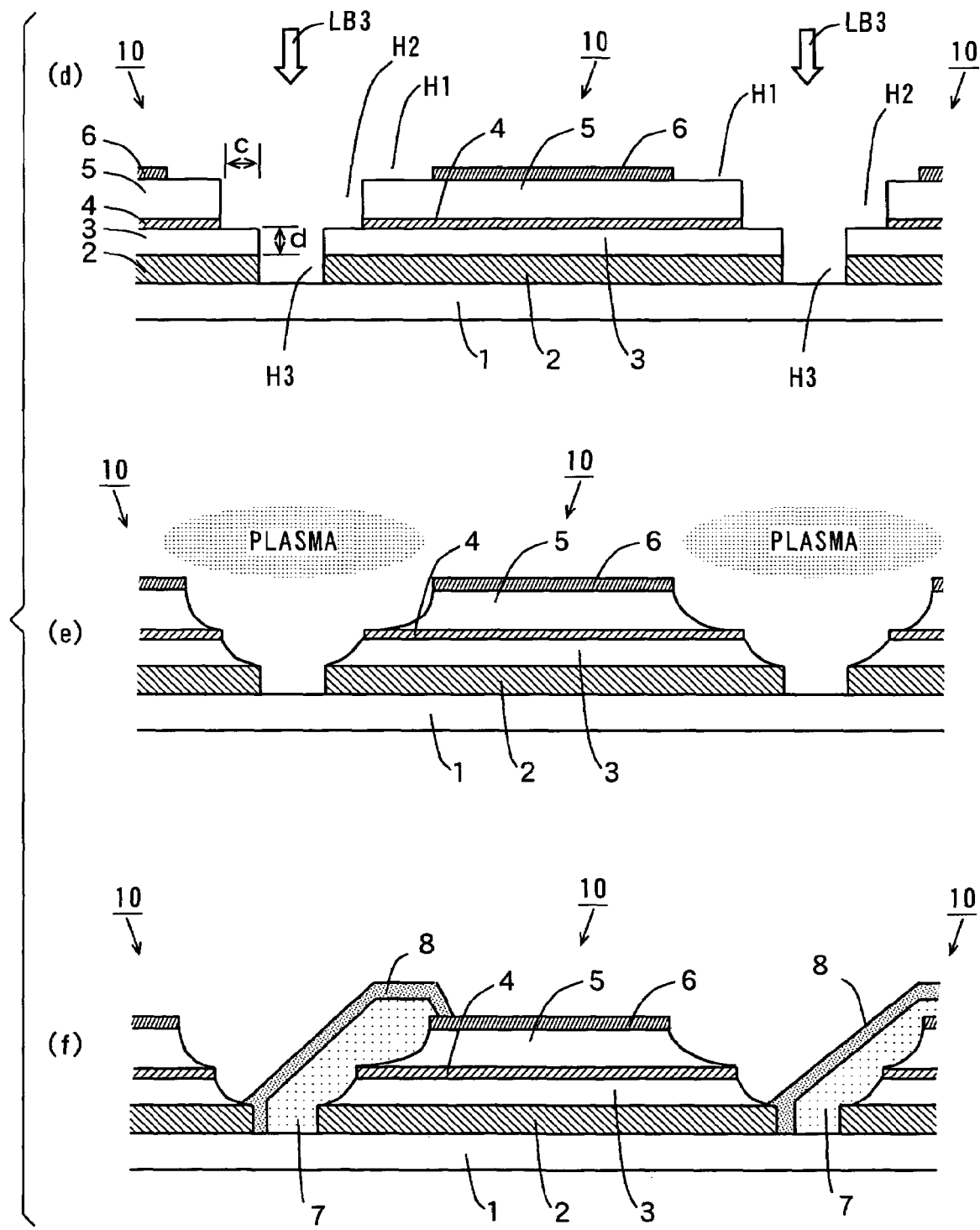

FIGS. 1 (a), 1 (b), 1 (c) and FIGS. 2 (d), 2 (e), 2 (f) are schematic cross sections showing the steps of a method for fabricating a tandem photovoltaic cell module according to a first embodiment of the invention.

First, as shown in FIG. 1 (a), a light receptive electrode 2, a first photovoltaic conversion layer 3, an intermediate reflective layer 4, a second photovoltaic conversion layer 5, and a back electrode 6 are formed in order on a transparent substrate 1.

The transparent substrate 1 may be made of a glass plate, a transparent resin film, or other suitable materials. The light receptive electrode 2 is made of a transparent conductive oxide such as ITO (indium-tin oxide), for example. The first photovoltaic conversion layer 3 has a structure that includes, from the light receptive electrode 2 side, a p-type amorphous silicon layer, an i-type amorphous silicon layer, and an n-type amorphous silicon layer.

The intermediate reflective layer 4 is made of a transparent conductive oxide such as ZnO, for example. The second photovoltaic conversion layer 5 has a structure that includes, from the intermediate reflective layer 4 side, a p-type crystalline silicon layer, an i-type crystalline silicon layer, and an n-type crystalline silicon layer. The back electrode 6 is made of a laminated film, for example, of a metal material such as silver, aluminum, titanium, and copper, and a metal oxide such as $ZnO$, ITO, and $SnO_2$.

Next, as shown in FIG. 1 (b), a plurality of first separation grooves H1 are formed by removing regions of a predetermined width from the back electrode 6, using laser beams LB1.

Then, as shown in FIG. 1 (c), second separation grooves H2 having a width smaller than that of the first separation grooves H1 are formed by removing the second photovoltaic conversion layer 5 and the intermediate reflective layer 4 inside the first separation grooves H1. At this time, the width and the position of each second separation groove H2 is set so that the distance a from an end of the second separation groove H2 to an end of a first separation grove H1 is greater than the thickness b of the second photovoltaic conversion layer 5.

Further, as shown in FIG. 2 (d), third separation grooves H3 having a width smaller than that of the second separation grooves H2 are formed by removing the photovoltaic conversion layer 3 and the light receptive electrode 2 inside each second separation groove H2, using laser beams LB3. At this time, the width and the position of each third separation groove H3 is set so that the distance c from an end of the third separation groove H3 to an end of a second separation groove H2 is greater than the thickness d of the first photovoltaic conversion layer 3. In this way, a plurality of tandem photovoltaic conversion cells (photovoltaic cells) 10 are formed on the transparent substrate 1.

YAG (yttrium aluminum garnet) laser beams, for example, are used as the laser beams LB1, LB2, LB3.

Next, as shown in FIG. 2 (e), corners of the first photovoltaic conversion layer 3 and corners of the second photovoltaic conversion layer 5 that are exposed in the separation grooves H1, H2, H3 are removed by performing plasma etching. Plasma etching is performed until the upper surfaces of both sides of the intermediate reflective layer 4 become exposed. A mixed gas of $CF_4$ and $O_2$ (95:5), for example, is used as an etching gas.

Then, as shown in FIG. 2 (f), an insulating paste 7 is formed so as to cover one side of each of the light receptive electrode 2, first photovoltaic conversion layer 3, intermediate reflective layer 4, second photovoltaic conversion layer 5, and back electrode 6. A grid electrode 8 is subsequently formed over the insulating paste 7 so as to provide an electrical connection between the back electrode 6 of each tandem photovoltaic conversion cell 10 and the light receptive electrode 2 of an adjacent tandem photovoltaic conversion cell 10. Thus, the plurality of tandem photovoltaic conversion cells 10 are serially connected.

In the photovoltaic cell module according to the embodiment, light is incident from the transparent substrate 1 side to the first photovoltaic conversion layer 3 and the second photovoltaic conversion layer 5 in each tandem photovoltaic conversion cell 10. Light with short wavelengths is absorbed by the first photovoltaic conversion layer 3, and light with long wavelengths is absorbed by the second photovoltaic conversion layer 5. This enables photovoltaic conversion of light in a wider range of wavelengths.

The function of the intermediate reflective layer 4 is now described. If the first photovoltaic conversion layer 3 and the second photovoltaic conversion layer 5 are equal in thickness, the amount of power generated in the first photovoltaic conversion layer 3 made of an amorphous silicon layer is less than that generated in the second photovoltaic conversion layer 5. Thus, the thickness of the first photovoltaic conversion layer 3 must be increased in order to equalize the amounts of power generated in the first photovoltaic conversion layer 3 and the second photovoltaic conversion layer 5. In that case, however, the first photovoltaic conversion layer 3 of an amorphous silicon layer with increased thickness shows a significant deterioration during long-term use.

In the photovoltaic cell module according to the embodiment, the intermediate reflective layer 4 is formed between the first photovoltaic conversion layer 3 and the second photovoltaic conversion layer 5 of each tandem photovoltaic conversion cell 10. This equalizes the amounts of power generated in the first photovoltaic conversion layer 3 and the second photovoltaic conversion layer 5. The intermediate reflective layer 4 reflects part of the light incident from the transparent substrate 1 side toward the first photovoltaic conversion layer 3 while transmitting the rest of the light. Thus, the amount of light incident to the first photovoltaic conversion layer 3 is greater than the light incident to the second photovoltaic conversion layer 5. As a result, the amounts of power generated in the first photovoltaic conversion layer 3 and the second photovoltaic conversion layer 5 can be made substantially equal without increasing the thickness of the first photovoltaic conversion layer 3.

Figure 3:
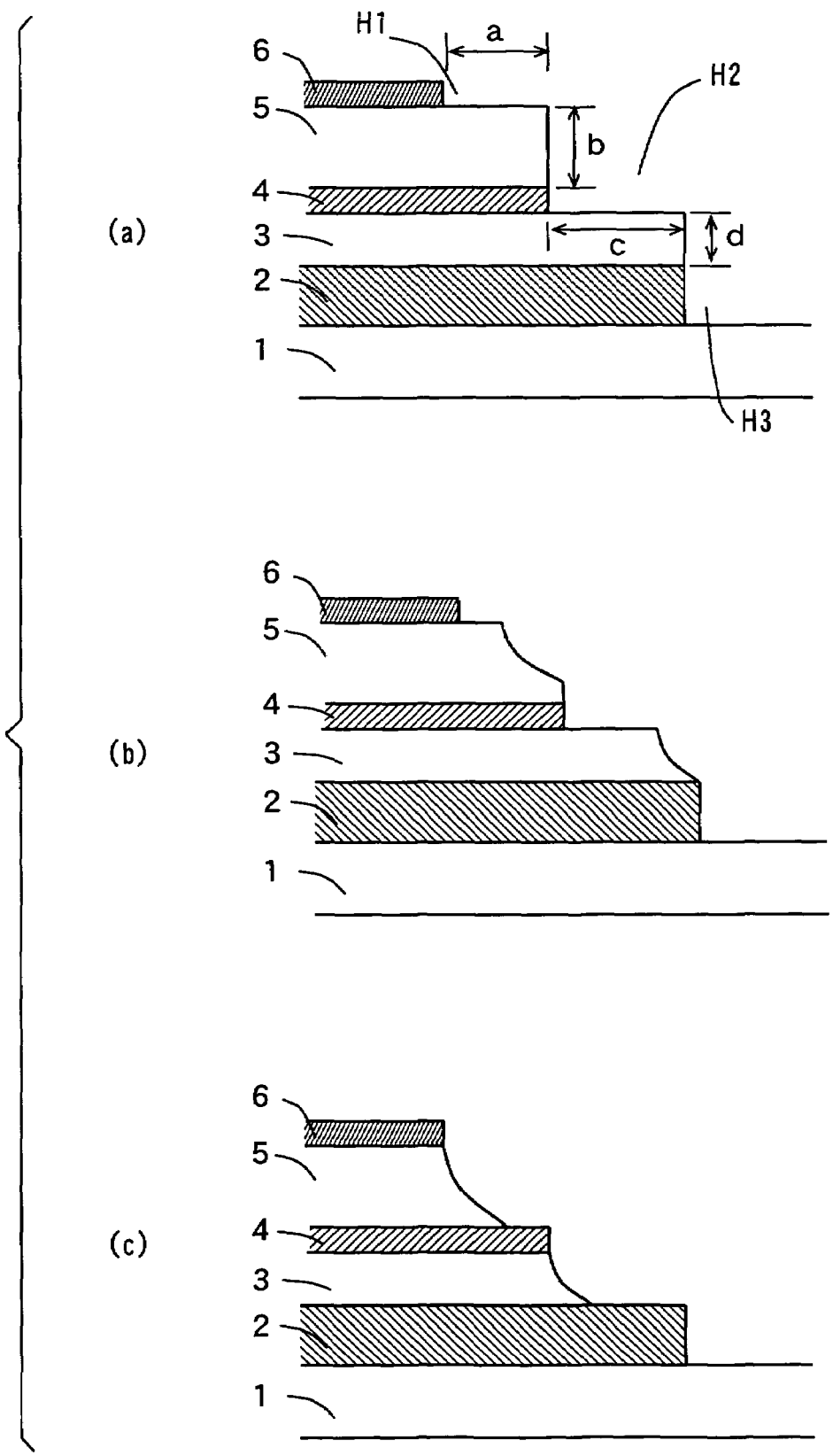
FIGS. 3 (a), 3 (b), 3 (c) are diagrams for illustrating details of the steps of FIG. 2 (e)

FIGS. 3 (*a*), 3 (*b*), 3 (*c*) are diagrams for illustrating details of the step of FIG. 2 (*e*). As shown in FIG. 3 (*a*), the distance a of the exposed portion of the second photovoltaic conversion layer 5 is set greater than the thickness b of the second photovoltaic conversion layer 5, and the distance c of the exposed portion of the first photovoltaic conversion layer 3 is set greater than the thickness d of the first photovoltaic conversion layer 3. This causes the corners of both ends of each of the first photovoltaic conversion layer 3 and the second photovoltaic conversion layer 5 to be gradually removed radially in an arcuate form, as shown in FIG. 3 (*b*). Etching is stopped when the side surfaces of the second photovoltaic conversion layer 5 reach the side surfaces of the back electrode 6, and the side surfaces of the first photovoltaic conversion layer 3 reach the side surfaces of the intermediate reflective layer 4. Thus, as shown in FIG. 3 (*c*), the upper surfaces of the side ends of the intermediate reflective layer 4 and the light receptive electrode 2 are exposed.

As described above, the distance a from an end of a second separation groove H2 to an end of a first separation groove H1 is set greater than the thickness b of the second photovoltaic conversion layer 5, and the distance c from an end of a third separation groove H3 to an end of a second separation groove H2 is set greater than the thickness d of the first photovoltaic conversion layer 3. This prevents the side ends of the back electrode 6 and the intermediate reflective layer 4 from remaining in the girder form even when etching is performed until the upper surfaces of the side ends of the intermediate reflective layer 4 and the light receptive electrode 2 are exposed. This prevents the side ends of the back electrode 6 and the intermediate reflective layer 4 from bending to contact the intermediate reflective layer 4 and the light receptive electrode 2, so as to prevent short circuits in the second photovoltaic conversion layer 5 and the first photovoltaic conversion layer 3.

In addition, for the photovoltaic cell module according to the embodiment, even if the first photovoltaic conversion layer 3 or the second photovoltaic conversion layer 5 is short-circuited, the short-circuited portion can be recovered by the reverse bias repair, as will now be described.

Figure 4:
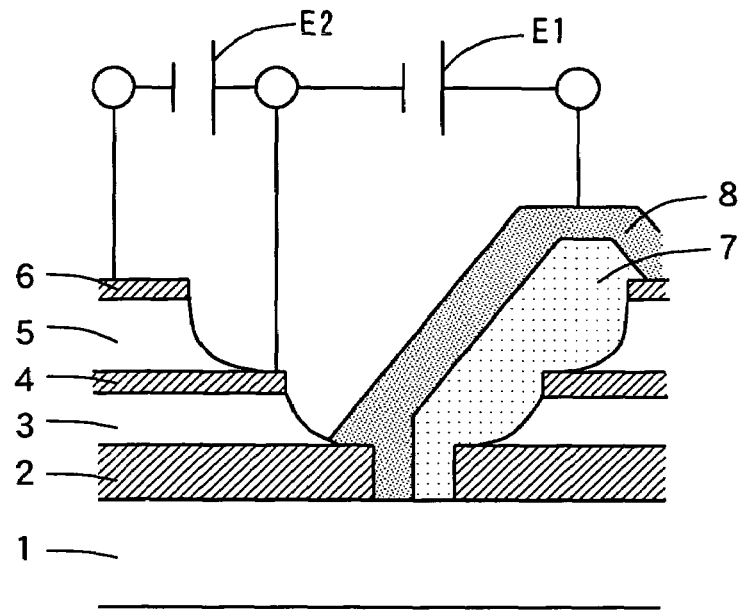
FIG. 4 is a diagram for illustrating a method for applying reverse bias voltages to the photovoltaic conversion cell in FIG. 2.

FIG. 4 is a diagram for illustrating a method of applying reverse bias voltages to each photovoltaic conversion cell 10. The upper surface of a side end of the intermediate reflective layer 4 is being exposed by etching. This exposed portion can be used as an electrode. Therefore, a direct current (dc) power supply E1 can be connected between the light receptive electrode 2 and the intermediate reflective layer 4 through the grid electrode 8, and a dc power supply E2 can also be connected between the intermediate reflective layer 4 and the back electrode 6. As a result, reverse bias voltages can be applied between the light receptive electrode 2 and the intermediate reflective layer 4 and between the intermediate reflective layer 4 and the back electrode 6, respectively.

Figure 5:
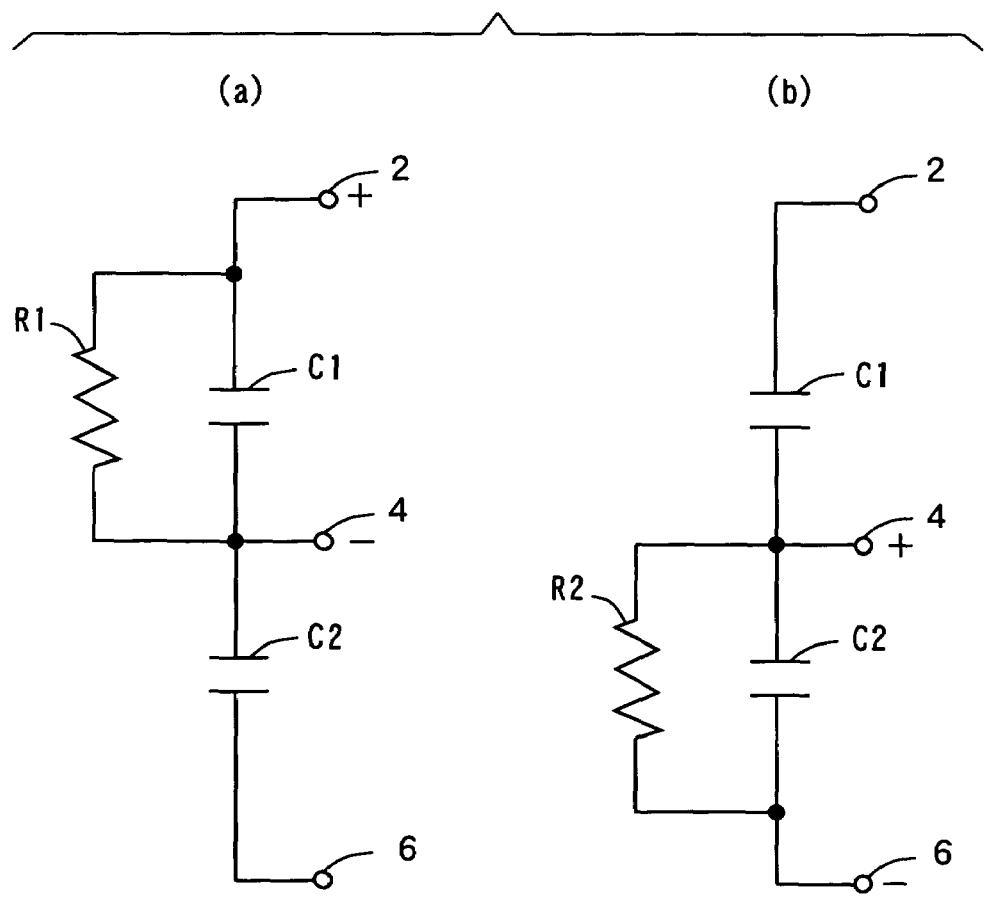
FIGS. 5 (a) and 5 (b) are diagrams each showing the equivalent circuit of a photovoltaic conversion cell when a reverse bias voltage is applied by the method described with reference to FIG. 4.

FIG. 5 (*a*) is a diagram showing the equivalent circuit of a photovoltaic conversion cell 10 during reverse bias repair when the first photovoltaic conversion layer 3 is short-circuited. FIG. 5 (*b*) is a diagram showing the equivalent circuit of a photovoltaic conversion cell 10 during reverse bias repair when the second photovoltaic conversion layer 5 is short-circuited. The first photovoltaic conversion layer 3 and the second photovoltaic conversion layer 5, which are equivalent to diodes, function as a capacitor C1 and a capacitor C2, respectively, when a reverse bias voltage is applied. The short-circuited portions, which are equivalent to the resistances, are represented by R1 and R2, respectively.

As shown in FIG. 5 (*a*), applying a reverse bias voltage between the light receptive electrode 2 and the intermediate reflective layer 4 allows a current to flow in the short-circuited portion R1 without being affected by the capacitor C2. This allows the short-circuited portion R1 to generate Joule's heat, causing the metal of the short-circuited portion R1 to become an insulator through oxidization or causes the metal to fly to pieces, so that the short-circuited portion R1 is recovered.

As shown in FIG. 5 (*b*), applying a reverse bias voltage between the intermediate reflective layer 4 and the back electrode 6 allows a current to flow in the short-circuited portion R2 without being affected by the capacitor C1. This allows the short-circuited portion R2 to generate Joule's heat, causing the metal of the short-circuited portion R2 to become an insulator through oxidization or causes the metal to fly to pieces, so that the short-circuited portion R2 is recovered.

As described above, in the photovoltaic cell module according to the embodiment, reverse bias voltages can be applied between the light receptive electrode 2 and the intermediate reflective layer 4 and between the intermediate reflective layer 4 and the back electrode 6, respectively. This enables the recovery of short-circuited portions using the reverse bias repair.

In the embodiment, the transparent substrate 1 corresponds to a substrate; the light receptive electrode 2 corresponds to a first electrode; the first photovoltaic conversion layer 3 corresponds to a first photovoltaic conversion layer; the intermediate reflective layer 4 corresponds to an intermediate reflective layer; the second photovoltaic conversion layer 5 corresponds to a second photovoltaic conversion layer; the back electrode 6 corresponds to a second electrode; each of the first grooves H1 corresponds to a first groove; each of the second grooves H2 corresponds to a second groove; each of the third grooves H3 corresponds to a third groove; and the grid electrode 8 corresponds to a connecting piece.

Second Embodiment

Figure 6:
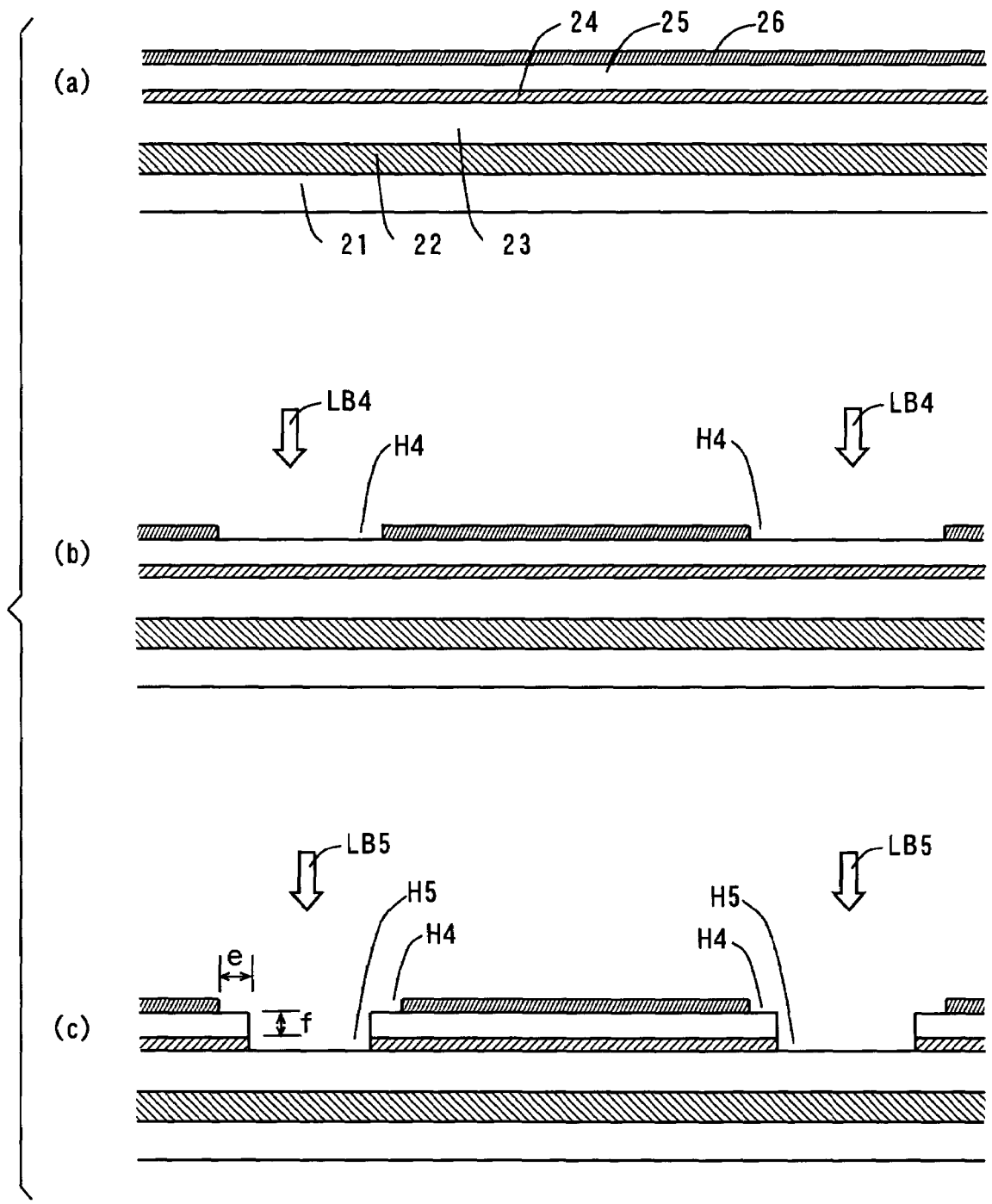
FIGS. 6 (a), 6 (b), 6 (c) are schematic cross sections showing the steps of a method for fabricating a tandem photovoltaic cell module according to a second embodiment of the invention.
Figure 7:
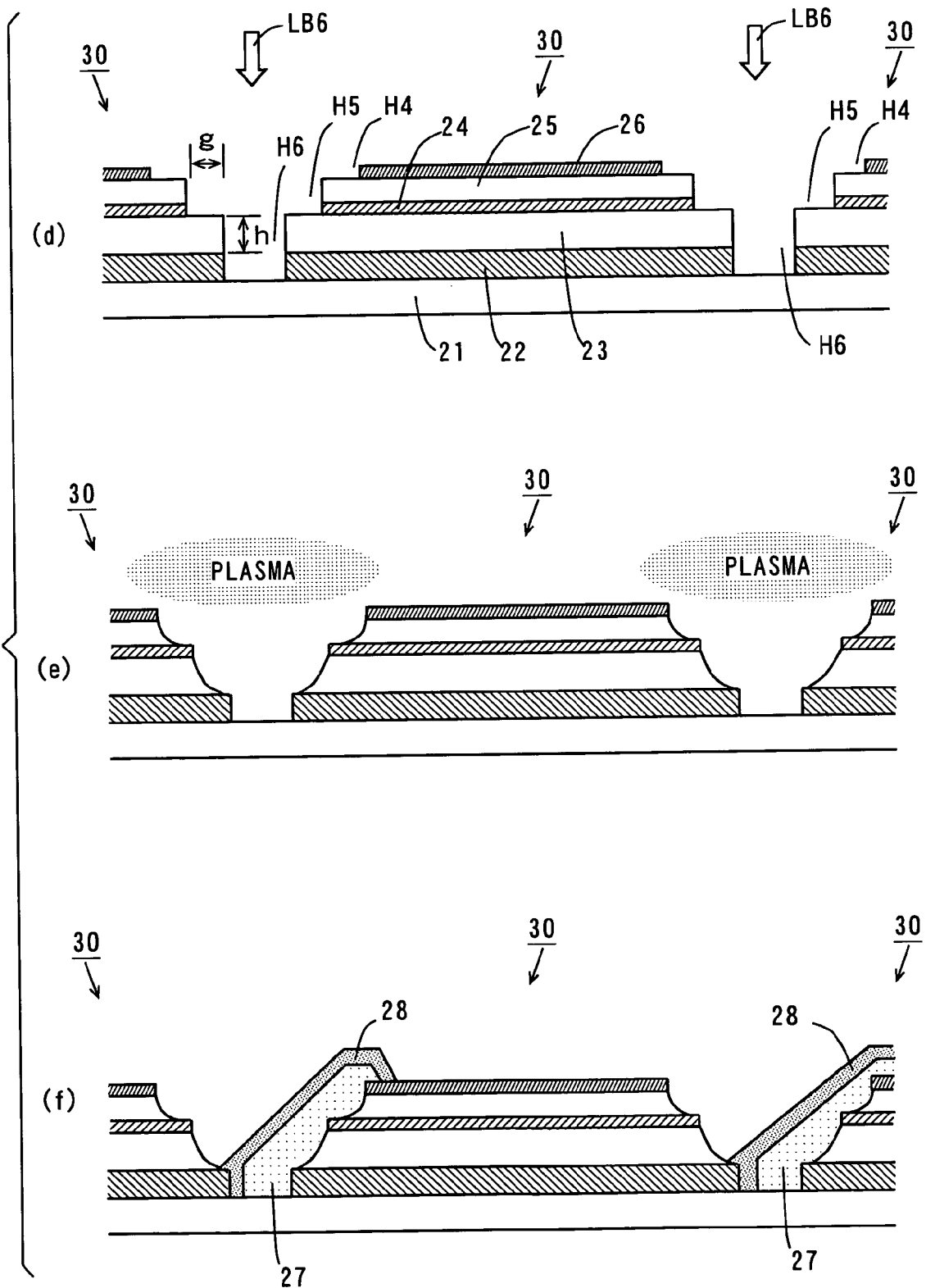
FIGS. 7 (d), 7 (e), 7 (f) are schematic cross sections showing the steps of the method for fabricating the tandem photovoltaic cell module according to the second embodiment of the invention.

FIGS. 6 (*a*), 6 (*b*), 6 (*c*) and FIGS. 7 (*d*), 7 (*e*), 7 (*f*) are schematic cross sections showing the steps of a method for fabricating a tandem photovoltaic cell module according to a second embodiment of the invention.

First, as shown in FIG. 6 (*a*), a back electrode 22, a first photovoltaic conversion layer 23, an intermediate reflective layer 24, a second photovoltaic conversion layer 25, and a light receptive electrode 26 are formed in order on a substrate 21.

The substrate 21 may be made, for example, of a thin plate of stainless onto which PES (polyethersulfone), PI (polyimide), or the like is adhered. The back electrode 22 is made of a laminated film, for example, of a metal material such as silver, aluminum, titanium, and copper, and a metal oxide such as ZnO, ITO, and $SnO_2$. The first photovoltaic conversion layer 23 has a structure that includes, from the back electrode 22 side, an n-type crystalline silicon layer, an i-type crystalline silicon layer, and a p-type crystalline silicon layer.

The intermediate reflective layer 24 is made of a transparent conductive oxide such as ZnO, for example. The second photovoltaic conversion layer 25 has a structure that includes, from the intermediate reflective layer 24 side, an n-type amorphous silicon layer, an i-type amorphous silicon layer, and a p-type amorphous silicon layer. The light receptive electrode 26 is made of a transparent conductive oxide such as ITO, for example.

Next, as shown in FIG. 6 (b), a plurality of first separation grooves H4 are formed by removing regions of a predetermined width from the light receptive electrode 26, using laser beams LB4.

Then, as shown in FIG. 6 (c), second separation grooves H5 having a width smaller than that of the first separation grooves H4 are formed by removing the second photovoltaic conversion layer 25 and the intermediate reflective layer 24 inside each first separation groove H4, using laser beams LB5. At this time, the width and the position of each second separation groove H5 is set so that the distance e from an end of the second separation groove H5 to an end of a first separation groove H4 is greater than the thickness f of the second photovoltaic conversion layer 25.

Further, as shown in FIG. 7 (d), third separation grooves H6 having a width smaller than that of the second separation grooves H5 are formed by removing the first photovoltaic conversion layer 23 and the back electrode 22 inside each second separation groove H5, using laser beams LB6. At this time, the width and the position of each third separation groove H6 is set so that the distance g from an end of the third separation groove H6 to an end of a second separation groove H5 is greater than the thickness h of the first photovoltaic conversion layer 23. In this manner, a plurality of tandem photovoltaic conversion cells (photovoltaic cells) 30 are formed on the substrate 21.

YAG laser beams, for example, are used as the laser beams LB4, LB5, LB6.

Next, as shown in FIG. 7 (e), corners of the second photovoltaic conversion layer 25 and corners of the first photovoltaic conversion layer 23 exposed in the separation grooves H4, H5, H6 are removed by performing plasma etching. Plasma etching is performed until the upper surfaces of both ends of the intermediate reflective layer 24 become exposed. A mixed gas of $CF_4$ and $O_2$ (95:5), for example, is used as an etching gas.

Then, as shown in FIG. 7 (f), an insulating paste 27 is formed so as to cover one side of each of the back electrode 22, first photovoltaic conversion layer 23, intermediate reflective layer 24, second photovoltaic conversion layer 25, and light receptive electrode 26. After this, a grid electrode 28 is formed over the insulating paste 27 so as to provide an electrical connection between the light receptive electrode 26 of each tandem photovoltaic conversion cell 30 and the back electrode 22 of an adjacent tandem photovoltaic conversion cell 30. Thus, the plurality of tandem photovoltaic conversion cells 30 are serially connected.

In the photovoltaic cell module according to the embodiment, light is incident from the light receptive electrode 26 side to the second photovoltaic conversion layer 25 and the first photovoltaic conversion layer 23 of each tandem photovoltaic conversion cell 30. Light of short wavelengths is absorbed by the second photovoltaic conversion layer 25, and light of long wavelengths is absorbed by the first photovoltaic conversion layer 23. This enables photovoltaic conversion of light in a wider range of wavelengths.

In the photovoltaic cell module according to the embodiment, the intermediate reflective layer 24 is formed between the second photovoltaic conversion layer 25 and the first photovoltaic conversion layer 23 of each tandem photovoltaic conversion cell 30. This equalizes the amounts of power generated in the second photovoltaic conversion layer 25 and the first photovoltaic conversion layer 23. The intermediate reflective layer 24 reflects part of the light incident from the light receptive electrode 26 side toward the second photovoltaic conversion layer 25 while transmitting the rest of the light. Thus, the amount of the light incident to the second photovoltaic conversion layer 25 is greater than the light incident to the first photovoltaic conversion layer 23. As a result, the amounts of power generated in the second photovoltaic conversion layer 25 and the first photovoltaic conversion layer 23 can be made substantially equal without increasing the thickness of the second photovoltaic conversion layer 25.

Figure 8:
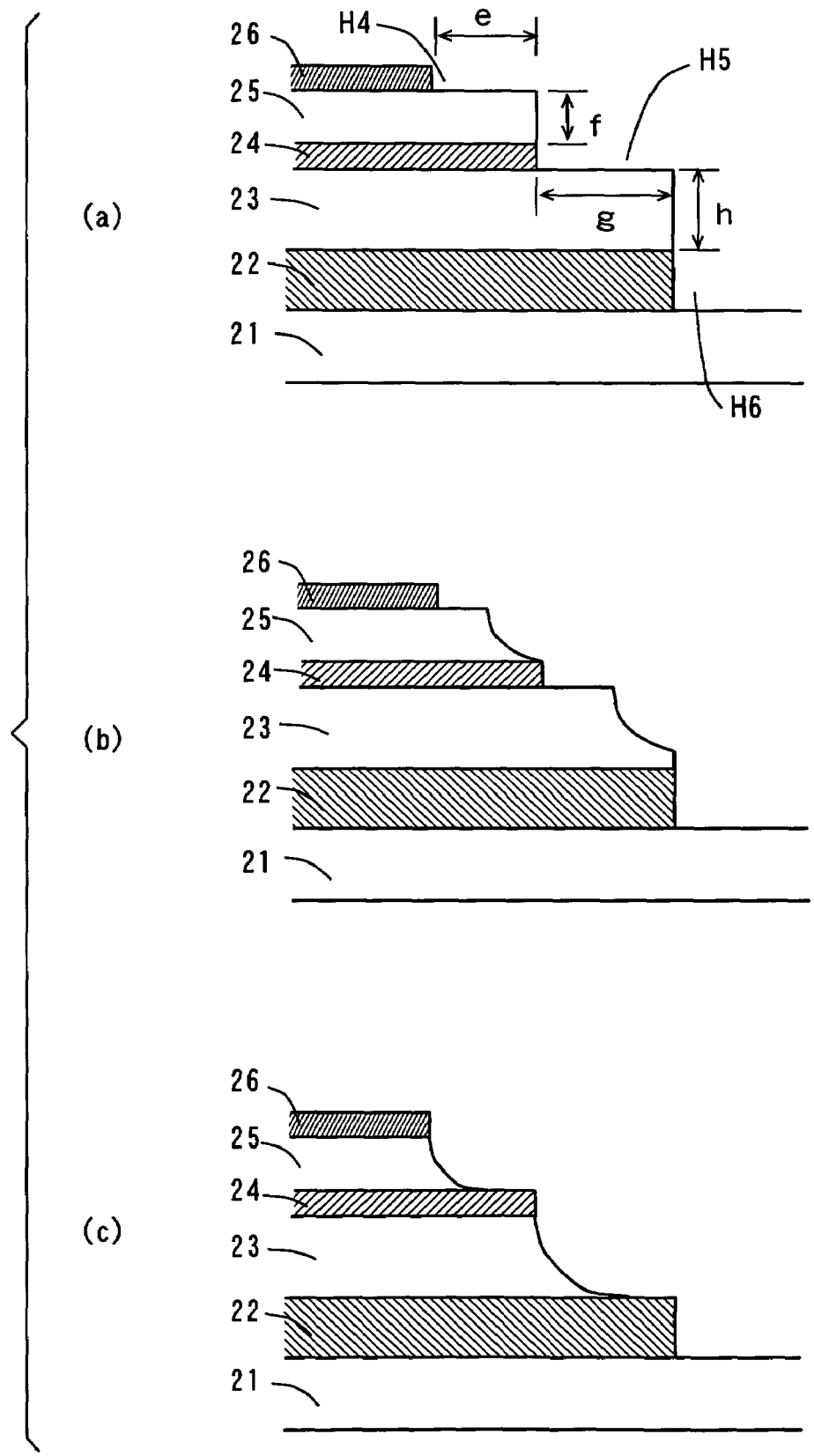
FIGS. 8 (a), 8 (b), 8 (c) are diagrams for illustrating details of the step of FIG. 7 (e)

FIGS. 8 (a), 8 (b), 8 (c) are diagrams for illustrating details of the step of FIG. 7 (e). As shown in FIG. 8 (a), the distance e of the exposed portion of the second photovoltaic conversion layer 25 is set greater than the thickness f of the second photovoltaic conversion layer 25, and the distance g of the exposed portion of the first photovoltaic conversion layer 23 is set greater than the thickness h of the second photovoltaic conversion layer 23. This causes the corners of both ends of each of the second photovoltaic conversion layer 25 and the first photovoltaic conversion layer 23 to be gradually removed radially in an arcuate form, as shown in FIG. 8 (b). Etching is stopped when the side surfaces of the second photovoltaic conversion layer 25 reach the side surfaces of the light receptive electrode 26, and the side surfaces of the first photovoltaic conversion layer 23 reach the side surfaces of the intermediate reflective layer 24. Thus, as shown in FIG. 8 (c), the upper surfaces of the side ends of the intermediate reflective layer 24 and the back electrode 22 are exposed.

As described above, the distance e from an end of a second separation groove H5 to an end of a first separation groove H4 is set greater than the thickness f of the second photovoltaic conversion layer 25, and the distance g from an end of a third separation groove H6 to an end of a second separation groove H5 is set greater than the thickness h of the first photovoltaic conversion layer 23. This prevents the side ends of each of the light receptive electrode 26 and the intermediate reflective layer 24 from remaining in the girder form even when etching is performed until the upper surfaces of the side ends of the intermediate reflective layer 24 and the back electrode 22 become exposed. This prevents the side ends of the light receptive electrode 26 and the intermediate reflective layer 24 from bending to contact the intermediate reflective layer 24 and the back electrode 22, so as to prevent short circuits in the second photovoltaic conversion layer 25 and the first photovoltaic conversion layer 23.

In addition, for the photovoltaic cell module according to the embodiment, even if the second photovoltaic conversion layer 25 or the first photovoltaic conversion layer 23 is short-circuited, the short-circuited portion can be recovered by the reverse bias repair, as will now be described.

Figure 9:
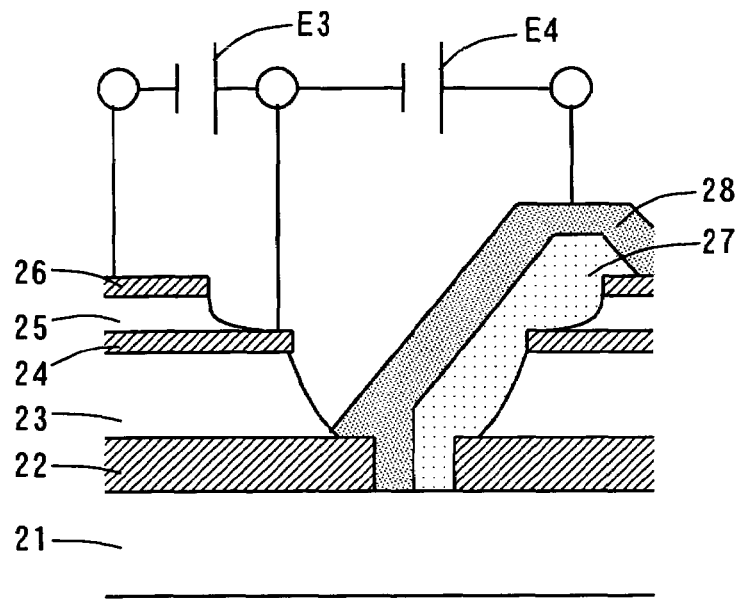
FIG. 9 is a diagram for illustrating a method for applying reverse bias voltages to the photovoltaic conversion cell in FIG. 7.

FIG. 9 is a diagram for illustrating a method for applying reverse bias voltages to each photovoltaic conversion cell 30. The upper surface of a side end of the intermediate reflective layer 24 is being exposed by etching. The exposed portion can be used as an electrode. Therefore, a dc power supply E3 can be connected between the intermediate reflective layer 24 and the light receptive electrode 26, and a dc power supply E4 can also be connected between the back electrode 22 and the intermediate reflective layer 24 through the grid electrode 28. As a result, reverse bias voltages can be applied between the intermediate reflective layer 24 and the light receptive electrode 26 and between the back electrode 22 and the intermediate reflective layer 24, respectively.

Figure 10:
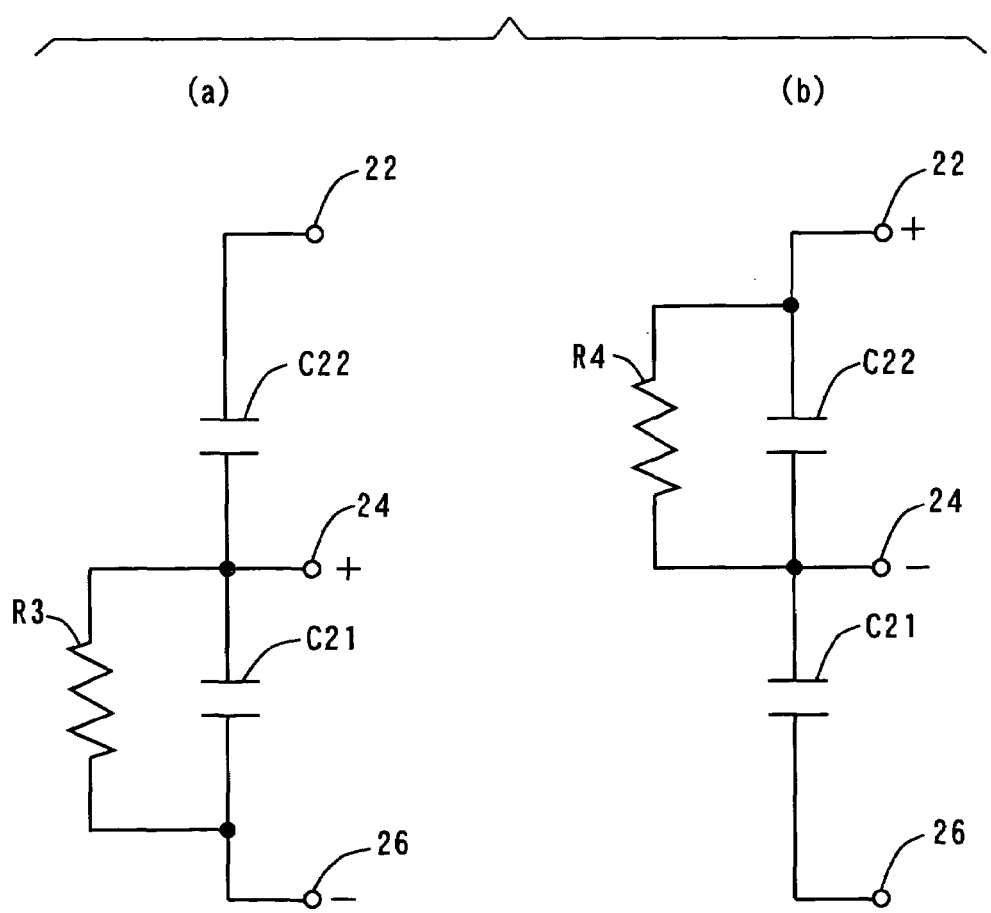
FIGS. 10 (a) and 10 (b) are diagrams each showing the equivalent circuit of a photovoltaic conversion cell when a reverse bias voltage is applied by the method described with reference to FIG. 9.

FIG. 10 (a) is a diagram showing the equivalent circuit of a photovoltaic conversion cell 30 during reverse bias repair when the second photovoltaic conversion layer 25 is short-circuited. FIG. 10 (b) is a diagram showing the equivalent circuit of a photovoltaic conversion cell 30 during reverse bias repair when the first photovoltaic conversion layer 23 is short-circuited. The second photovoltaic conversion layer 25 and the first photovoltaic conversion layer 23, which are equivalent to diodes, function as a capacitor C21 and a capacitor C22, respectively, when a reverse bias voltage is applied. The short-circuited portions, which are equivalent to the resistances, are represented by R3 and R4, respectively.

As shown in FIG. 10 (a), applying a reverse bias voltage between the intermediate reflective layer 24 and the light receptive electrode 26 allows a current to flow in the short-circuited portion R3 without being affected by the capacitor C22. This allows the short-circuited portion R3 to generate Joule's heat, causing the metal of the short-circuited portion R3 to be an insulator through oxidization or the metal to fly to pieces, so that the short-circuited portion R3 is recovered.

As shown in FIG. 10 (b), applying a reverse bias voltage between the back electrode 22 and the intermediate reflective layer 24 allows a current to flow in the short-circuited portion R4 without being affected by the capacitor C21. This allows the short-circuited portion R4 to generate Joule's heat, causing the metal of the short-circuited portion R4 to be an insulator through oxidization or the metal to fly to pieces, so that the short-circuited portion R4 is recovered.

As described above, in the photovoltaic cell module according to the embodiment, reverse bias voltages can be applied between the intermediate reflective layer 24 and the light receptive electrode 26 and between the back electrode 22 and the intermediate reflective layer 24, respectively. This enables the recovery of short-circuited portions using the reverse bias repair.

In this embodiment, the substrate 21 corresponds to a substrate; the back electrode 22 corresponds to a first electrode; the first photovoltaic conversion layer 23 corresponds to a first photovoltaic conversion layer; the intermediate reflective layer 24 corresponds to an intermediate reflective layer; the second photovoltaic conversion layer 25 corresponds to a second photovoltaic conversion layer; the light receptive electrode 26 corresponds to a second electrode; each of the first grooves H4 correspond to a first groove; each of the second grooves H5 corresponds to a second groove; each of the third grooves H6 corresponds to a third groove; and the grid electrode 28 corresponds to a connecting piece.

(Other Modifications)

In the above-described embodiments, both of the tandem photovoltaic conversion cells 10, 30 have a structure that includes two of photovoltaic conversion layers, i.e., the first photovoltaic conversion layer 3, 23 and the second photovoltaic conversion layers 5, 25, respectively. Each tandem photovoltaic conversion cell may, however, have a structure that includes more than two photovoltaic conversion layers. In addition, the upper surfaces of the side ends of each of the light receptive electrode 2 and the back electrode 22, which are exposed by etching in the above-described embodiment, may not be exposed. In that case, the grid electrode 8 is electrically connected to a side surface of the light receptive electrode 2, while the grid electrode 28 is electrically connected to a side surface of the back electrode 22.

EXAMPLES

In Examples, photovoltaic cell modules were fabricated as follows according to the procedure shown in FIG. 6 and FIG. 7.

A 0.2-mm thin plate of stainless to which PES was adhered was used as a substrate 21. A laminated film of 200-nm silver and 100-nm ZnO was used as a back electrode 22. A 3-µm crystalline silicon layer that includes, from the substrate 21 side, an n-type microcrystalline silicon layer, an i-type microcrystalline silicon layer, and a p-type microcrystalline silicon layer was used as a first photovoltaic conversion layer 23. ZnO with a thickness of 40 nm was used as an intermediate reflective layer 24. A 300-nm amorphous silicon layer that includes, from the intermediate reflective layer 24 side, an n-type amorphous silicon layer, an i-type amorphous silicon layer, and a p-type amorphous silicon layer was used as a second photovoltaic conversion layer 25. ITO with a thickness of 75-nm was used as a light reflective electrode 26.

The third harmonics of YAG laser beams with a wavelength of 355 nm, a lasing frequency of 10 kHz, and an average power of 0.45 W were used as laser beams LB4. Similar laser beams were used as laser beams LB5 except having an average power of 1.2 W. YAG laser beams with a wavelength of 1064 nm, a lasing frequency of 10 kHz, and an average power of 4.2 W were used as laser beams LB6. Plasma etching in the step of FIG. 7 (e) was performed for 2 min in a mixed gas of $CF_4:O_2=95:5$.

According to the foregoing conditions, four kinds of photovoltaic cell modules having distances e and g of 10 µm, 30 µm, 50 µm, and 100 µm, respectively, were fabricated. The photovoltaic cell modules were examined for variations in the maximum power output by conducting moisture resistance tests according to JIS C 8918.

Figure 11:
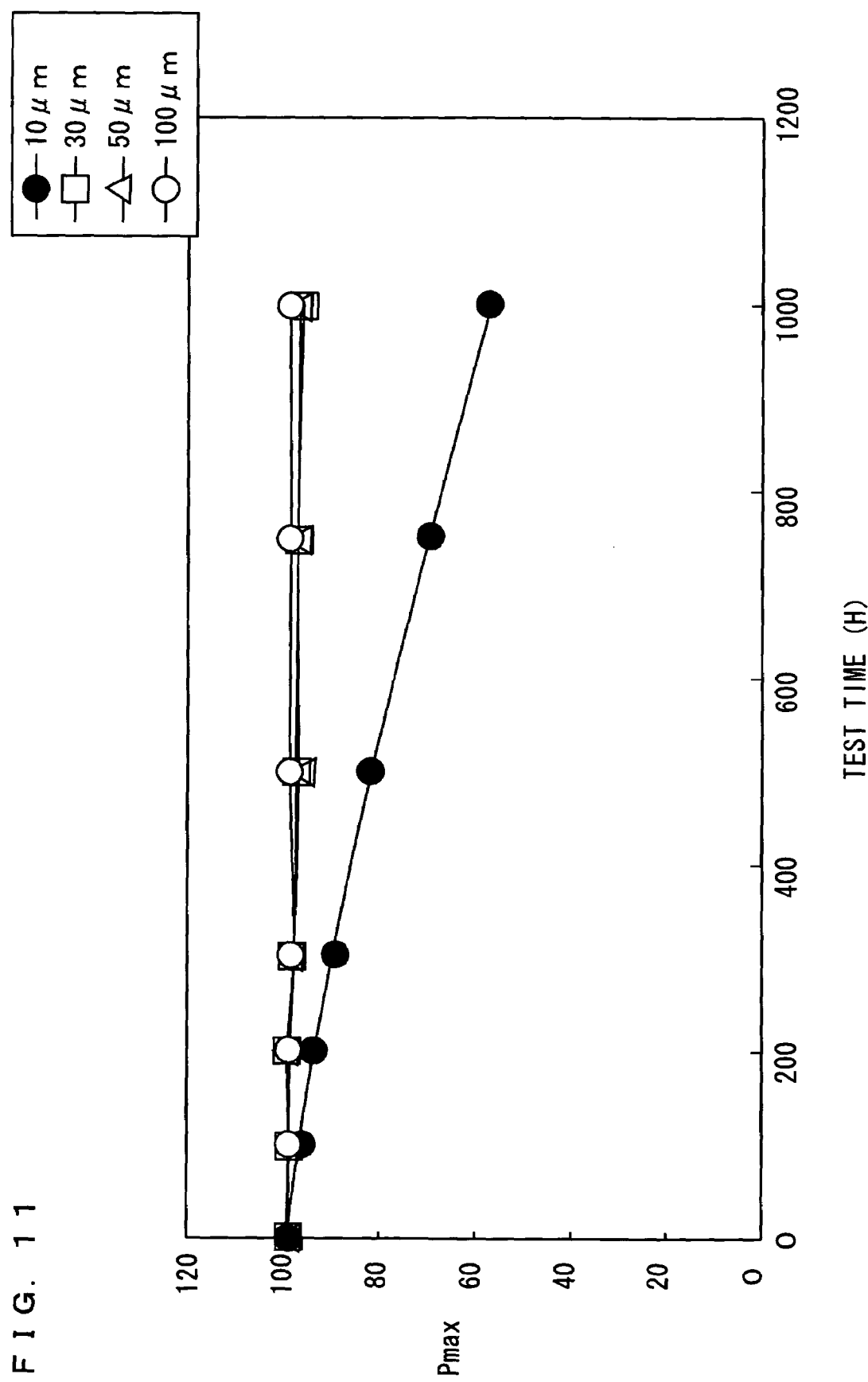
FIG. 11 is a graph showing measurements of moisture resistance tests in Examples.
Figure 12:
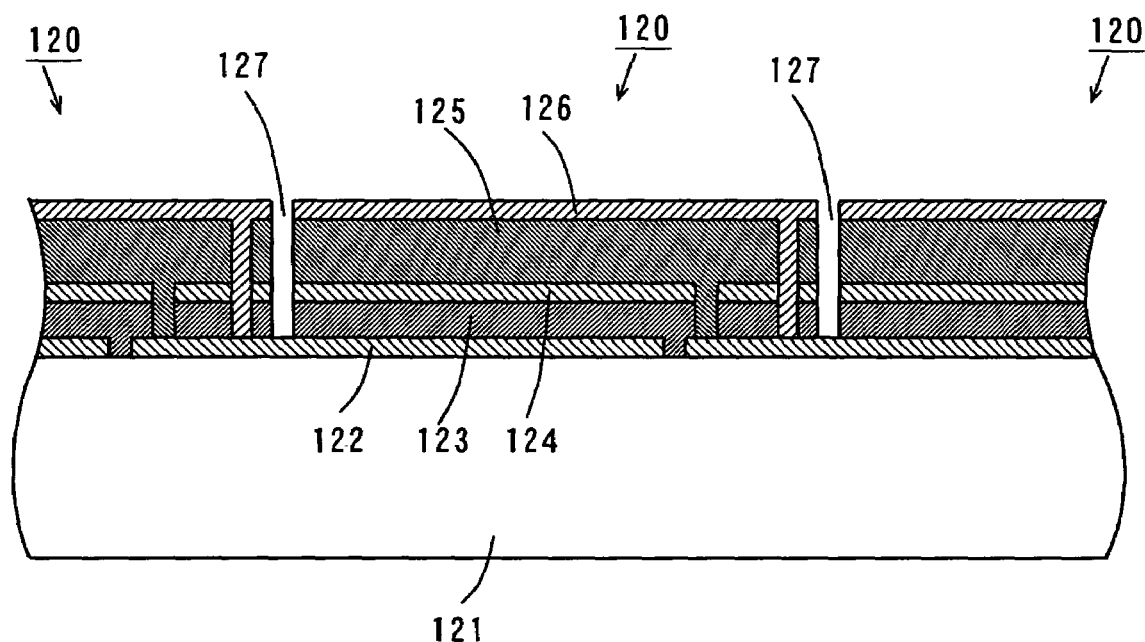
FIG. 12 is a cross section showing an example of a conventional thin film photovoltaic conversion module.
Figure 13:
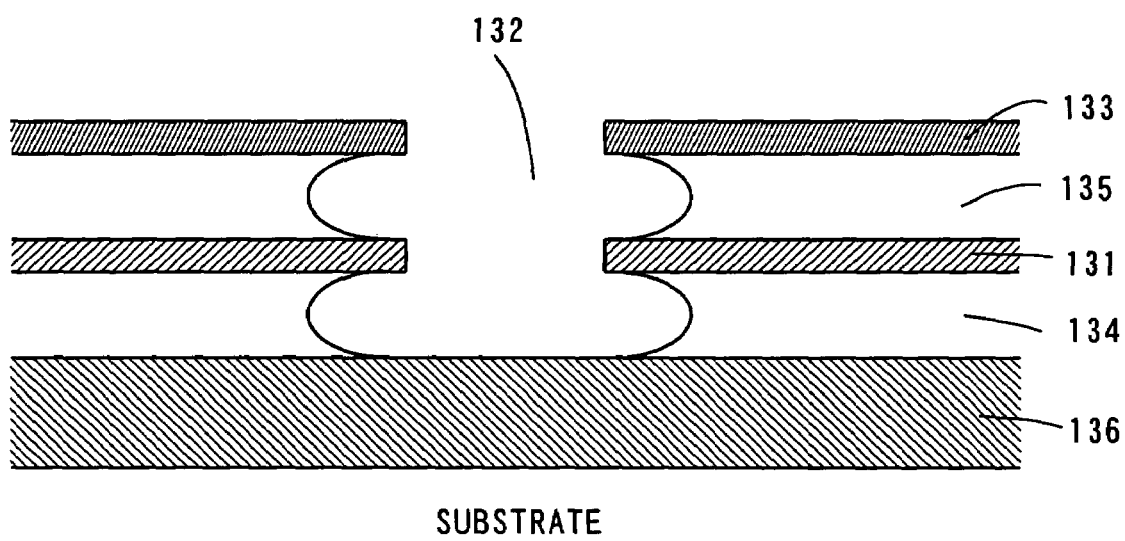
FIG. 13 is a diagram for illustrating problems during the formation of separation grooves in a thin film photovoltaic conversion module.
Figure 14:
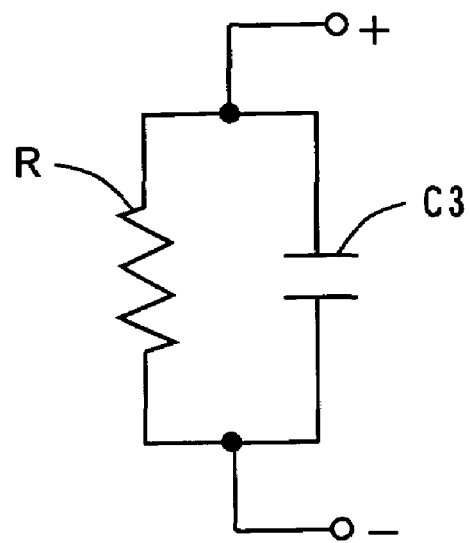
FIG. 14 is a diagram showing the equivalent circuit of a single-layer photovoltaic conversion cell when a reverse bias voltage is applied.
Figure 15:
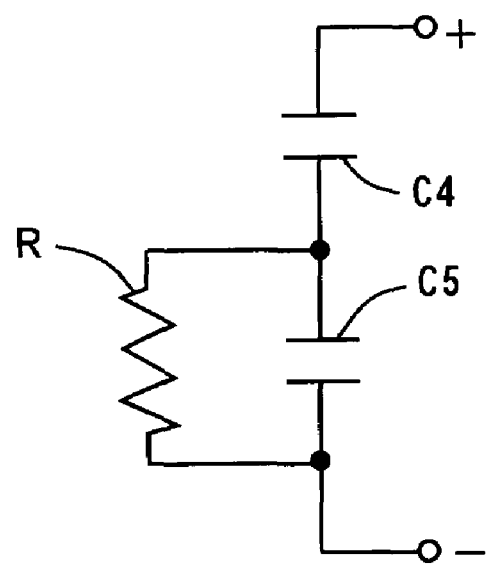
FIG. 15 is a diagram showing the equivalent circuit of a tandem photovoltaic conversion cell with two photovoltaic conversion layers when a reverse bias voltage is applied.

FIG. 11 shows measurements of variations over time in the maximum power output (Pmax) from the moisture resistance tests. In FIG. 11, with the initial maximum power output being set at 100, variations over time in the maximum power output for each photovoltaic cell module are represented. As can be seen from FIG. 11, the photovoltaic cell module with distances e and g of 10 µm showed a substantial decrease in the output, whereas the photovoltaic cell modules with distances e and g of 30 µm or greater each showed a 5% or less decrease after 1000 hours, i.e., the criterion for determining the moisture resistance in accordance with JIS (Japanese Industrial Standards). The results revealed that each of the distances e and g is preferably 30 µm or greater.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a photovoltaic cell comprising the steps of:
   forming, in order, a first electrode, a first photovoltaic conversion layer, a conductive intermediate reflective layer, a second photovoltaic conversion layer, and a second electrode;
   forming a first groove by removing a region of a predetermined width from said second electrode;

forming a second groove having a width smaller than that of said first groove by removing said second photovoltaic conversion layer and said intermediate reflective layer in said first groove;

forming a third groove having a width smaller than that of said second groove by removing said first photovoltaic conversion layer and said first electrode in said second groove; and removing said second photovoltaic conversion layer at an edge portion of said second groove so that an upper surface of a side end of said intermediate reflective layer is exposed, and also removing said first photovoltaic conversion layer at an edge portion of said third groove.

2. The method of fabricating the photovoltaic cell according to claim 1, wherein
said step of removing said first photovoltaic conversion layer includes the step of removing said first photovoltaic conversion layer in said third groove so that an upper surface of a side end of said first electrode is exposed.

3. The method of fabricating the photovoltaic cell according to claim 1, wherein
said step of forming said second groove includes the step of forming said second groove so that the distance between a side end of said second electrode and a side end of said second photovoltaic conversion layer is greater than the thickness of said second photovoltaic conversion layer, and
said step of forming said third groove includes the step of forming said third groove so that the distance between a side end of said intermediate reflective layer and a side end of said first photovoltaic conversion layer is greater than the thickness of said first photovoltaic conversion layer.

4. The method of fabricating the photovoltaic cell according to claim 1, wherein
said step of forming said first groove includes the step of removing said second electrode using a laser beam.

5. The method of fabricating the photovoltaic cell according to claim 1, wherein
said step of forming said second groove includes the step of removing said second photovoltaic conversion layer and said intermediate reflective layer using a laser beam.

6. The method of fabricating the photovoltaic cell according to claim 1, wherein
said step of forming said third groove includes the step of removing said first photovoltaic conversion layer and said first electrode using a laser beam.

7. The method of fabricating the photovoltaic cell according to claim 1, wherein
said step of removing said second photovoltaic conversion layer at an edge portion of said second groove, and also removing said first photovoltaic conversion layer at an edge portion of said third groove includes the step of removing said second photovoltaic conversion layer and said first photovoltaic conversion layer by plasma etching.

8. The method of fabricating the photovoltaic cell according to claim 1, further comprising the step of applying a reverse bias voltage between one of said first and second electrodes and said exposed upper surface of said intermediate reflective layer.

* * * * *